(12) United States Patent
Kye

(10) Patent No.: US 6,602,794 B1
(45) Date of Patent: Aug. 5, 2003

(54) SILYLATION PROCESS FOR FORMING CONTACTS

(75) Inventor: Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/802,437

(22) Filed: Mar. 9, 2001

(51) Int. Cl.⁷ .................... H01L 21/302; H01L 21/461
(52) U.S. Cl. .................... 438/725; 438/694; 438/700; 438/780; 438/781
(58) Field of Search .................... 438/758, 759, 438/760, 761, 778, 725, 780, 781, 694, 700, 701, FOR 132

(56) References Cited

U.S. PATENT DOCUMENTS

| | | | | |
|---|---|---|---|---|
| 4,803,181 A | * | 2/1989 | Buchmann et al. | 438/696 |
| 4,808,511 A | * | 2/1989 | Holmes | 430/325 |
| 5,486,424 A | * | 1/1996 | Nakato et al. | 428/451 |
| 5,877,075 A | * | 3/1999 | Dai et al. | 438/597 |
| 6,107,177 A | | 8/2000 | Lu et al. | 438/597 |
| 6,258,514 B1 | * | 7/2001 | Montgomery | 430/315 |
| 6,294,314 B1 | * | 9/2001 | Liao | 430/313 |

FOREIGN PATENT DOCUMENTS

| | | | | |
|---|---|---|---|---|
| JP | 0409237833 A | * | 9/1997 | H01L/21/768 |

OTHER PUBLICATIONS

Bomy Chen et al. "Selective silylation and plasma patterning of photoresist in submicrom lithography", 1991, VLSITSA, pp. 28–32.*

Ki–Ho Baik et al., "Comparative Study Between Gas–and Liquid–Phase Silylation for the Diffusion–Enhanced Silylated Resist Process," Journal of Vacuum Science and Technology B, vol. 9, No. 6, Nov./Dec. 1991, pp. 3399–3405.

I. Satou et al., "Sub–0. 10 um Hole Fabrication Using Bi–Layer Silylation Process for 193 nm Lithography," Semiconductor Leading Edge Technologies, Inc., Japan, pp. 80–81.

Ulrich Schaedeli et al., "Bilayer Resist Approach for 193–nm Lithography," SPIE, vol. 2724, (1996), pp. 344–354.

U.S. Ser. No. 09/775,084 filed Feb. 1, 2001 "Thinning of Trench and Line or Contact Spacing by Use of Dual Layer Photoresist" By Ghandehari, et al.

M. Sebald et al., "Chemical Amplification of Resist Lines (CARL)," Microelectronic Engineering 11, (1990), pp. 531–534, Elsevier Science Publishers B.V.

David Wheeler et al., "Aminodisilanes as Silylating Agents for Dry–Developed Positive–Tone Resists for Deep Ultraviolet (248nm) and Extreme Ultraviolet (13.5nm) Microlithography," SPIE, vol. 2438, pp. 762–774.

* cited by examiner

Primary Examiner—Amir Zarabian
Assistant Examiner—Maria Guerrero
(74) Attorney, Agent, or Firm—Foley & Lardner

(57) ABSTRACT

A method of forming narrow trenches in a layer of photoresist is disclosed. The method includes providing a photoresist layer and patterning the photoresist layer to form a plurality of apertures having sidewalls. The method can also include silylating the sidewalls of the apertures in the photoresist layer and reflowing the photoresist layer. The process can be utilized to form contacts having widths which are less than one lithographic feature wide.

20 Claims, 9 Drawing Sheets

SILYATION PROCESS FOR FORMING CONTACTS

CROSS REFERENCE TO RELATED APPLICATIONS

The present application is related to U.S. application Ser. No. 09/775,084 entitled, "Thinning of Trench and Line or Contact Spacing by use of Dual Layer Photoresist", filed by Ghandehari, et al., on Feb. 1, 2001, assigned to the Assignee of the present application.

FIELD OF THE INVENTION

The present specification relates to the fabrication of integrated circuits (ICs). More specifically, the present specification relates to a silylation patterning process for forming integrated circuit features.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation illuminates selected areas of the surface through an intervening master template, the mask, for a particular pattern. The radiation can be light, such as ultra-violet light, vacuum ultra-violet (VUV) light and deep ultra violet light. The radiation can also be x-ray radiation, e-beam radiation, etc.

The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to conventional projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelengths in the range of 50 to 700 Angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

The photoresist material or layer associated with conventional lithographic technologies is often utilized to selectively form various IC structures, regions, and layers. Generally, the patterned photoresist material can be utilized to define doping regions, deposition regions, etching regions, or other structures associated with an integrated circuit (IC). A conventional lithographic system is generally utilized to project the pattern to the photoresist material or layer. The photoresist material may be either a positive or a negative photoresist layer.

In the case of a positive photoresist material or layer, the light causes photochemical reaction in the photoresist layer. The photoresist layer is removable with a developer solution at the portions of the photoresist that are exposed to light through a mask. The photoresist layer is developed to clear away those portions. An integrated circuit feature, such as a gate, via, or interconnect, is then etched or doped into the layer of material, and the remaining photoresist is removed. In the case of a negative photoresist material, the light causes the photoresist layer to be removable with a developer solution at portions of the photoresist layer that are not exposed to light through the mask.

Various types of photoresist materials are manufactured by a number of manufacturers. The photoresist material can include multiple photoresist films (i.e. a multi-level resist (MLR)). According to some conventional processes, the photoresist layer is provided over an anti-reflective coating (ARC), such as silicon nitride ($Si_3N_4$) or silicon oxynitride (SiON). The anti-reflective coating is disposed above the material which is to be processed.

Conventional processes have utilized a variety of resolution enhancement technologies for lithographically creating patterns which define lines and spaces. These processes include the use of phase shift masks, the use of reflow operations and the use of ultrathin photoresist layers. Conventional resolution enhancement technologies have not been utilized to provide contact holes or conductive vias. Attenuated phase shift masks are the only tool typically utilized to enhance the resolution associated with contact patterns. Therefore, contact patterns have been relatively large patterns.

According to conventional reflow processes, the photoresist layer is applied as a thick photoresist layer. Thick photoresist layers can have thicknesses over 0.5 microns. The thick photoresist layer is patterned. After patterning, the photoresist layer is developed and heated to a high temperature (e.g. between 120–170 degrees Celsius).

When heated, the photoresist layer becomes almost plasticized (e.g., viscous). The photoresist layer flows due to the higher temperatures associated with the heating step. The heating of the thick photoresist layer reduces the width associated with features in the resist pattern (the edges of the resist pattern flow closer together, thereby making a smaller hole or trench). After the photoresist layer has been heated (i.e., reflowed), conventional semiconductor processes are performed.

Reflow technologies require thick photoresist layers to ensure that a sufficient amount of material is available to reflow. The use of thick photoresist layers has an adverse effect on lithographic resolution. Variations in thickness uniformity can affect the precision associated with focusing the radiation on the photoresist layer (i.e., it is difficult to have a precise depth of focus when the photoresist layer is thick).

Other conventional processes have utilized ultrathin photoresist layers. Ultrathin photoresist layers have achieved greater resolution than thick photoresist layers. However, reflow technologies have not been applied to ultrathin photoresist layers because the ultrathin photoresist layer does not provide adequate material for the flow operation (the ultrathin photoresist layer is too thin to provide sufficient material to flow without compromising other areas of the photoresist layer).

Conventional integrated circuit fabrication techniques may also include a process known as silylation. For example, U.S. Pat. No. 6,107,177 describes a silylation method for protecting photoresist and preventing photoresist loss. Generally, silylation involves the introduction of a gas or a liquid containing silicon agents which react with silicon containing materials. Silicon containing agents include hexamethyl disilazane (HMDS), hexamethyl cyclotrisilazane, trimethylsilyl ethyl isocyanate and/or dimethysilyl dimethylamine. Silicon containing agents may be supplied as a gas in a dry silylation method. Alternatively, silylation may be provided by employing a wet chemistry method. Often, dry chemistries can provide a more uniform and controlled silylation process. Heretofore, a silylation process has not been utilized to significantly reduce critical trench dimensions.

Thus, there is a need to pattern IC devices using non-conventional lithographic techniques. Further, there is a need to form smaller feature sizes, such as, smaller contact holes. Yet further, there is a need for a hybrid photoresist reflow process and a silylation process. Even further still, there is a need for a hybrid silylation and ultrathin photoresist process. Yet even further, there is a need for a hybrid ultrathin photoresist layer and reflow process.

SUMMARY OF THE INVENTION

An exemplary embodiment relates to a method of fabricating an integrated circuit. The method includes providing a photoresist layer over a semiconductor substrate, forming an aperture in the photoresist layer, and silylating the photoresist layer. The aperture has a width which is decreased after silylating the photoresist layer. The method also includes reflowing the photoresist layer to further decrease the width of the aperture.

An exemplary embodiment also relates to a method of fabricating a contact for an integrated circuit. The method includes providing a photoresist layer over an insulating layer above a substrate, patterning the photoresist layer to remove a portion, silylating the photoresist layer, and reflowing the photoresist layer.

Still another embodiment relates to a method of forming narrow trenches in a layer of photoresist. The method includes providing a photoresist layer, patterning the photoresist layer to form apertures having sidewalls. The method also includes silylating sidewalls of the apertures in the photoresist layer and reflowing the photoresist layer.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF PREFERRED EXEMPLARY EMBODIMENTS

Figure 1:
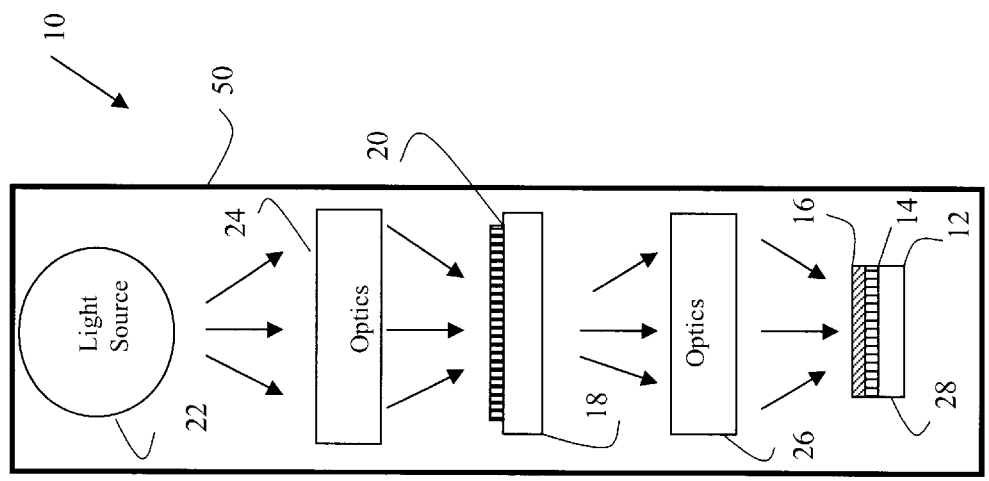
FIG. 1 is a general schematic block diagram of a lithographic system for processing a substrate according to an exemplary embodiment, the substrate can be processed to include contacts through an insulating layer.

Referring to FIG. 1, a substrate 12 is shown in a lithographic system 10. Substrate 12 can be a semiconductor substrate, such as, silicon, gallium arsenide, germanium, or other substrate material. Substrate 12 can include one or more layers of material and/or features, such as, lines, interconnects, vias, doped portions, etc., and can further include devices, such as, transistors, microactuators, microsensors, capacitors, resistors, diodes, etc. Substrate 12 can be an entire IC wafer or part of an IC wafer. Substrate 12 can be part of an integrated circuit, such as, a memory, a processing unit, an input/output device, etc.

Lithographic system 10 provides a pattern of radiation to substrate 12. System 10 can include a chamber 50. Chamber 50 can be a vacuum or low pressure chamber for use in VUV lithography. Chamber 50 can contain any of numerous types atmospheres, such as, nitrogen, etc. Alternatively, lithographic system 10 can be utilized in various other types of lithography including lithography that uses radiation at any number of wavelengths.

Lithographic system 10 includes a light source 22, a condenser lens assembly 24, a reticle or a mask 18, an objective lens assembly 26, and a stage 28. Stage 28 supports substrate 12 and can move substrate 12 with respect to lens assembly 26. System 10 can have a variety of configurations and arrangements. The configuration of system 10 shown in FIG. 1 is exemplary.

System 10 can include mirrors, beam splitters, and other components arranged according to other designs. System 10 can be embodied as a lithographic camera or stepper unit. An example of lithographic system 10 is a PAS5500/xxx series machine manufactured by ASML. Other examples include Microscan DUV systems by Silicon Valley Group or an XLS family Microlithography System by Integrated Solutions, Inc. of Korea.

Substrate 12 can include a layer of material 14 thereon. Layer of material 14 can be an insulative layer, a conductive layer, a barrier layer, or other layer of material which is to be etched, doped, or layered using the process described herein. In one embodiment, material 14 is a hard mask layer, such as, a silicon nitride layer, a metal layer, or other material. The hard mask layer can serve as a patterned layer for processing of substrate 12 or for processing a layer upon substrate 12. In another embodiment, material 14 is an anti-reflective coating (ARC). In the preferred embodiment, material 14 is an insulating layer through which a contact is provided. Various integrated circuit features may be fabricated using the method described herein.

Substrate 12 and layer of material 14 are not described in a limiting fashion. The principles of the present invention can be applied to any integrated circuit substrate, wafer, mask layer, or other layer. Substrate 12 and the layer of material 14 can be conductive, semiconductive, or insulative.

A layer of lithographic material, such as, a photoresist layer or material 16 is deposited over layer of material 14. Photoresist material 16 can comprise any of a variety of photoresist chemicals suitable for lithographic applications. Material 16 can be comprised of a matrix material or resin, a sensitizer or inhibitor, and a solvent. Photoresist material 16 is preferably a low-contrast photoresist, but may alternatively be a high-contrast photoresist.

Photoresist material 16 is deposited by, for example, spin-coating over layer of material 14. Material 16 can be provided with a thickness of less than 1.0 microns. Preferably, photoresist material 16 has a thickness between 0.5 and 0.05 microns. Further, photoresist material 16 may be either a positive photoresist or a negative photoresist and can be an organic or non-organic photoresist material.

Photoresist material 16 can be a 0.1 micron thick layer of chemically amplified type photoresist manufactured by Shipley, TOK, Clariant. In one embodiment, material 16 is an ultrathin photoresist layer. Alternatively, material 16 can be DNQ type 1-line or g-line photoresist. Material 16 can be provided over an anti-reflective coating (ARC), or can be a multi-level resist (MLR) material.

Reticle or mask 18 is a binary mask in this exemplary embodiment. Mask 18 has a translucent substrate preferably fabricated from glass or quartz, and an opaque layer 20, such as chromium or chromium oxide, patterned thereon. Alternatively, mask 18 can be an attenuating phase shift mask, an alternating phase shift mask, or other mask reticle. Opaque layer 20 is patterned to provide a desired circuit pattern to photoresist material 16.

Light source 22 provides light or radiation (e.g., ultraviolet (UV) light) through mask 18 to photoresist layer 16. Light source 22 is an excimer laser in this exemplary embodiment having a wavelength of 365, 248 nanometers (nm), 193 nm, or 157 nm. Alternatively, light source 22 may be any other light source having different wavelengths, including i-line DUV, VUV, or EUV wavelengths.

Figure 2:
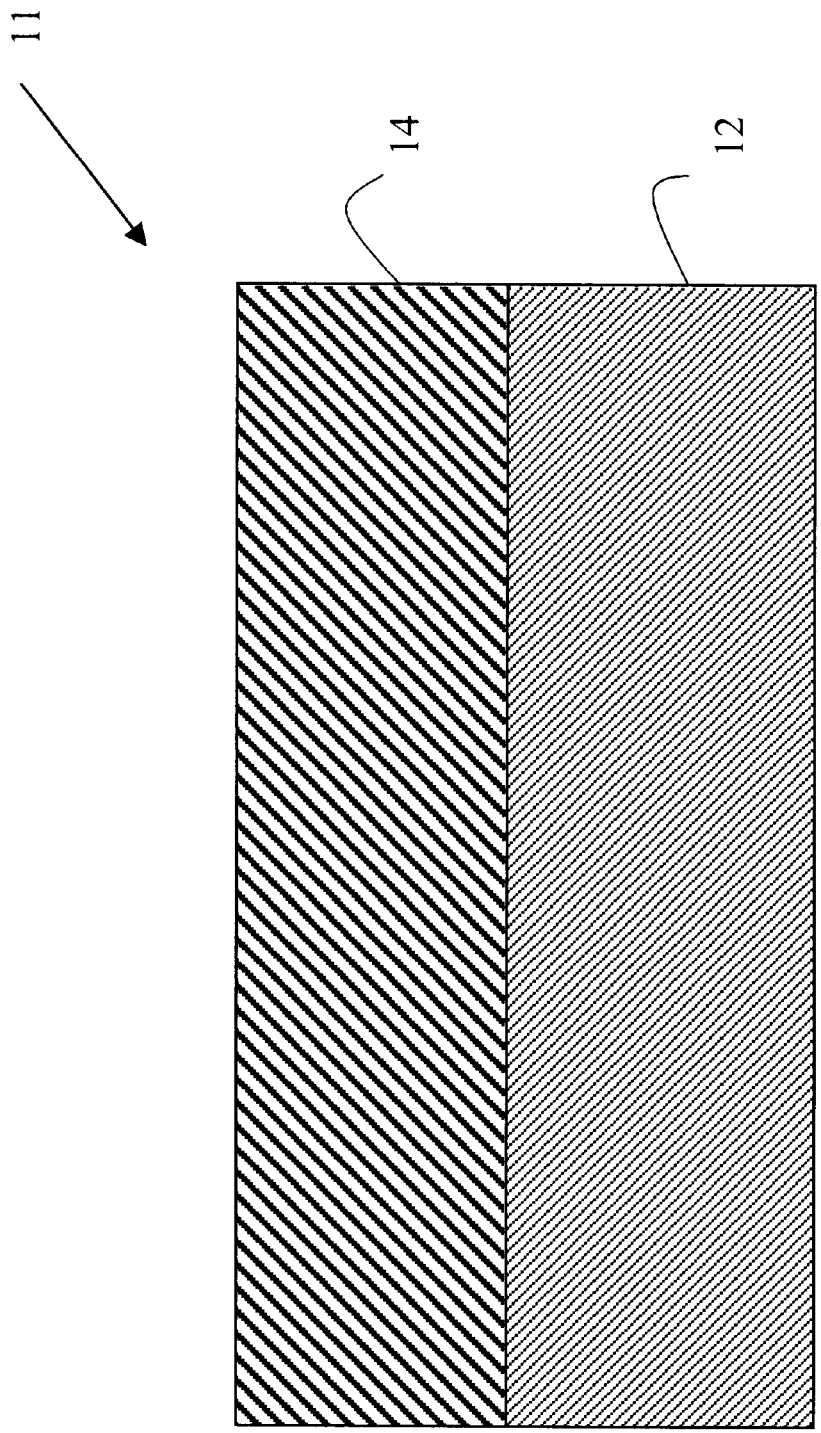
FIG. 2 is a schematic cross sectional view of the substrate patterned by the lithographic system of FIG. 1, illustrating an insulating layer deposition step.

With reference to FIGS. 2–8, an exemplary process for processing at least a portion 11 of substrate 12 is described below as follows. With reference to FIG. 2, substrate 12 includes material 14 embodied as a 0.5 nm thick insulating layer. Preferably, substrate 12 includes transistors, or other devices upon it which are covered by insulating layer 14.

Layer 14 can be a silicon dioxide material deposited by chemical vapor deposition (CVD). For example, material 14 can be tetraethylorthosilicate (TEOS) deposited silicon dioxide.

Figure 3:
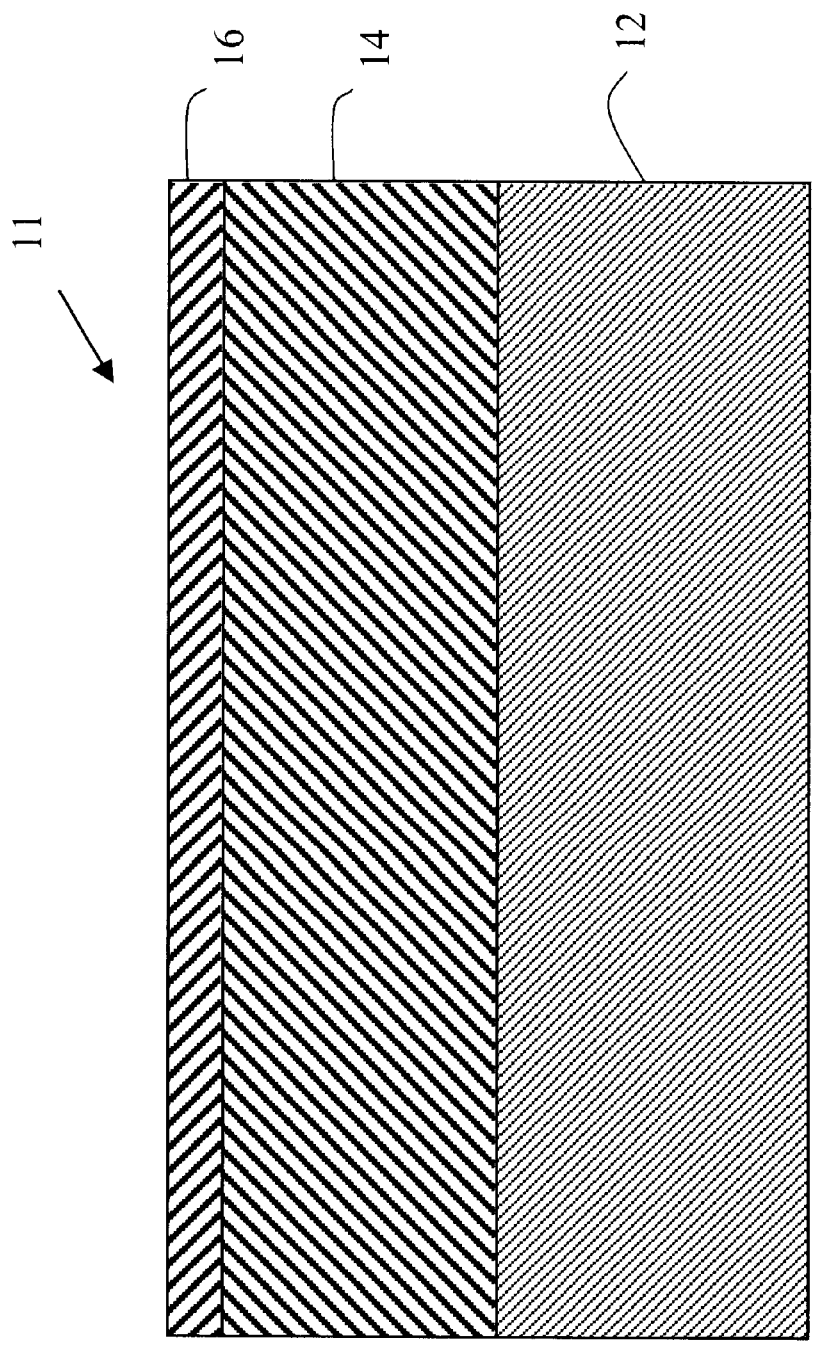
FIG. 3 is a schematic cross-sectional view of the substrate patterned by the lithographic system of FIG. 1, illustrating a photoresist application step according to an exemplary embodiment.

With reference to FIG. 3, substrate 12 includes a photoresist material 16 disposed above material 14. Photoresist material 16 is preferably an ultrathin layer of photoresist applied to substrate 12. Photoresist material 16 can be applied by a spin coating machine, such as, an automated in-line wafer spin coater. For example, substrate 12 can be rotated to a speed of 2000–3000 rpm while photoresist material 16 is applied. In one embodiment, photoresist material 16 is a 0.1 micron thick layer.

Material 14 can be cleaned and primed before the application of material 16. In addition, an anti-reflective coating can be provided above layer 14 before material 16 is applied.

Figure 4:
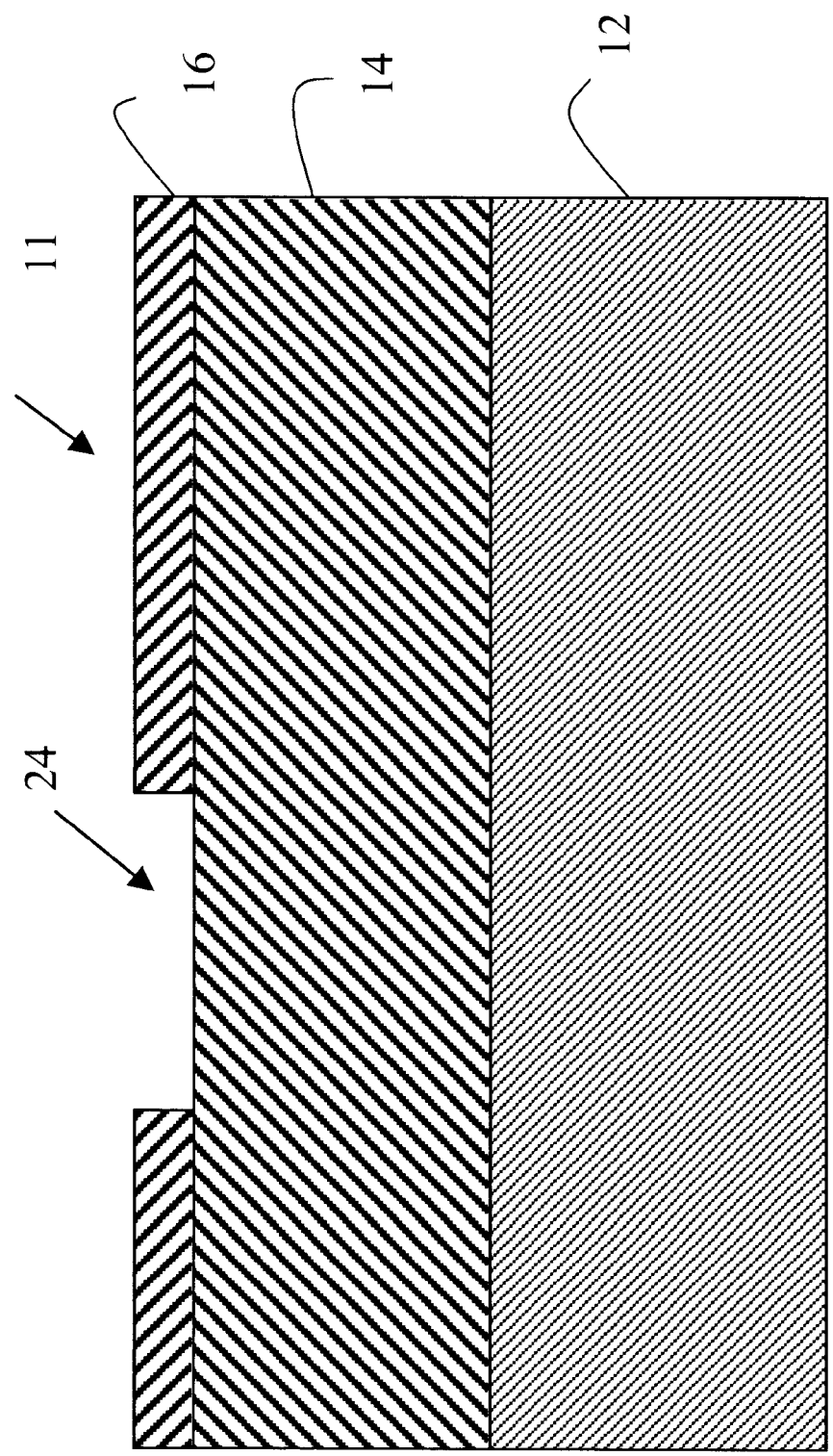
FIG. 4 is a schematic cross-sectional view of the substrate patterned by the lithographic system of FIG. 1, illustrating a patterning step according to another exemplary embodiment.

With reference to FIG. 4, light source 22 (FIG. 1) provides an exposure of light or radiation through mask 18 to selectively expose a portion of photoresist material 16. The portion is associated with aperture 24 (FIG. 4). Material 16 exposed to the radiation in a system, such as, lithographic system 10 (FIG. 1), is removed to form aperture 24.

In chamber 50 of system 10, a predetermined amount of light energy, typically measured in $mJ/cm^2$ (millijoules per square centimeter), is provided to photoresist material 16, which is a factor of the intensity of light source 22, the duration of the light provided, the wavelength of the light, and also the composition of photoresist material 16 and any attenuation provided by mask 18. For example, between 10 and 15 $mJ/cm^2$ can be applied in this first exposure step, using a light source having a 248 nm wavelength. In this exemplary embodiment, a positive photoresist is utilized, and sufficient light energy is provided through mask 18 a portion of material 16 associated with aperture 24 to chemically change such a portion associated with aperture 24. A developer solution is provided to remove the portion associated with aperture 24. The developer solution is typically a solvent which renders the portion associated with aperture 24 soluble after being exposed to a sufficient amount of light energy. Any type of lithographic technology can be used to pattern material 16. For example, UV, deep UV, VUV, or EUV lithographic equipment can be used to pattern photoresist material 16.

Figure 5:
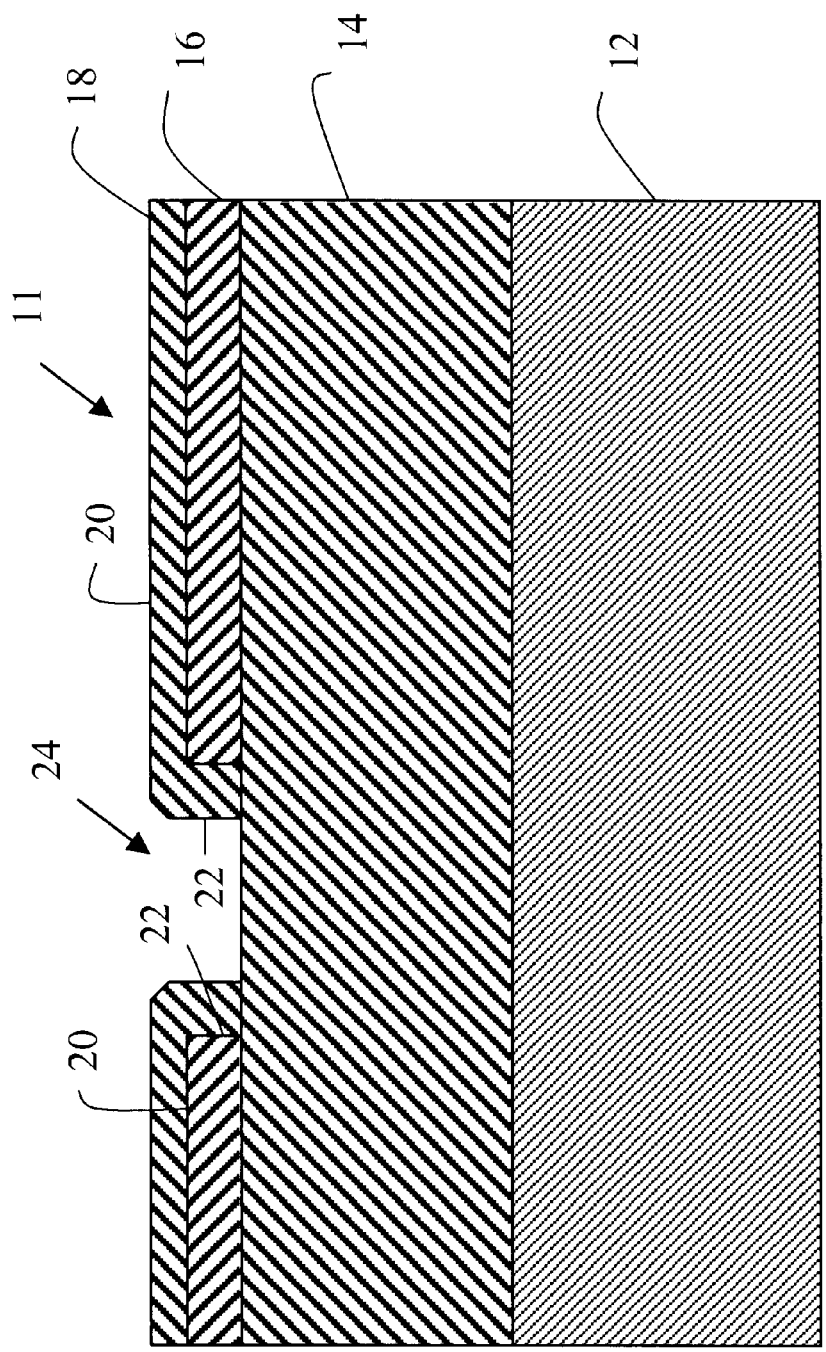
FIG. 5 is a schematic cross-sectional view of the substrate patterned by the lithographic system of FIG. 1, illustrating a silylating step according to yet another exemplary embodiment.

In FIG. 5, a cross-sectional view of portion 11 illustrates that photoresist material 16 undergoes a silylation process which results in the swelling of lateral sidewalls 22 of photoresist material 16. In an exemplary embodiment, silylation is carried out by gas phase silylation or liquid phase silylation. Silylation involves the introduction of a gas or liquid containing silicon agents which react with exposed portions of photoresist material 16. This reaction results in the swelling or increasing of the size of the exposed portion.

In an exemplary embodiment, Si-containing agents include hexamethyl disilazane (HMDS), hexamethylcyclotrisilazane, trimethylsilyl ethyl isocyanate and/or dimethylsilyldimethylamine. Si-containing agents may be supplied as a gas in a dry silylation method. One dry silylation method includes providing HMDS at a temperature between 50 and about 150 degrees Celsius, and a pressure of between about 1 and about 200 Torr. Other temperatures and pressures may be employed depending on the amount of silylation desired. For example, if it is desired to silylate a depth of approximately 30 nm, HMDS exposure time would be about 10 seconds at about 90 degrees Celsius and about 50 Torr.

In alternative embodiments, silylation may be provided by employing either a wet chemistry or dry chemistry method. Dry chemistries can provide a more uniform and controlled silylation process. In exemplary embodiments, silylation occurs at a depth of between about 200 Å and 1000 Å. As such, in an exemplary embodiment, silylated sidewalls 22 grow inward reducing the width of the spaces etched in photoresist material 16 (e.g., the width of aperture 24). In an exemplary embodiment, swelling of sidewalls due to silylation results in a process consistent of $k_1$ <0.5 for the width of aperture 24 (where w=$k_1 \cdot \lambda$/NZ, w: width, $\lambda$: wavelength, NA: numerical aperture, $k_1$: process constant).

Advantageously, silylated sidewalls 22 grow inward to decrease the minimum size possible for spaces in photoresist material 16. After photoresist material 16 is silylated and the sizes of spaces or trenches (aperture 24) are decreased, photoresist material 16 is used to pattern integrated circuit features. In an exemplary embodiment, integrated circuit features include contacts, trenches, polysilicon gates, or any other feature utilized in integrated circuits or in the manufacture of integrated circuits.

In an exemplary embodiment, aperture 24 is circular, square shaped, or rectangularly shaped for the formation of a contact or conductive via through layer 14. The contact can be formed utilizing resolution enhancement technologies to shrink the size of the contact. In one preferred embodiment, aperture 24 is less than one lithographic feature or $k_1$ is 0.6 or less.

Silylation creates silylation material 18 over material 16 including sidewalls 22 of aperture 24. Preferably, the combination of material 16 and silylation material 18 has a thickness of 0.2 microns. In one embodiment, the material 16 can have a thickness of 0.1 microns, and silylation material 18 can have a thickness of 0.1 microns.

Figure 6:
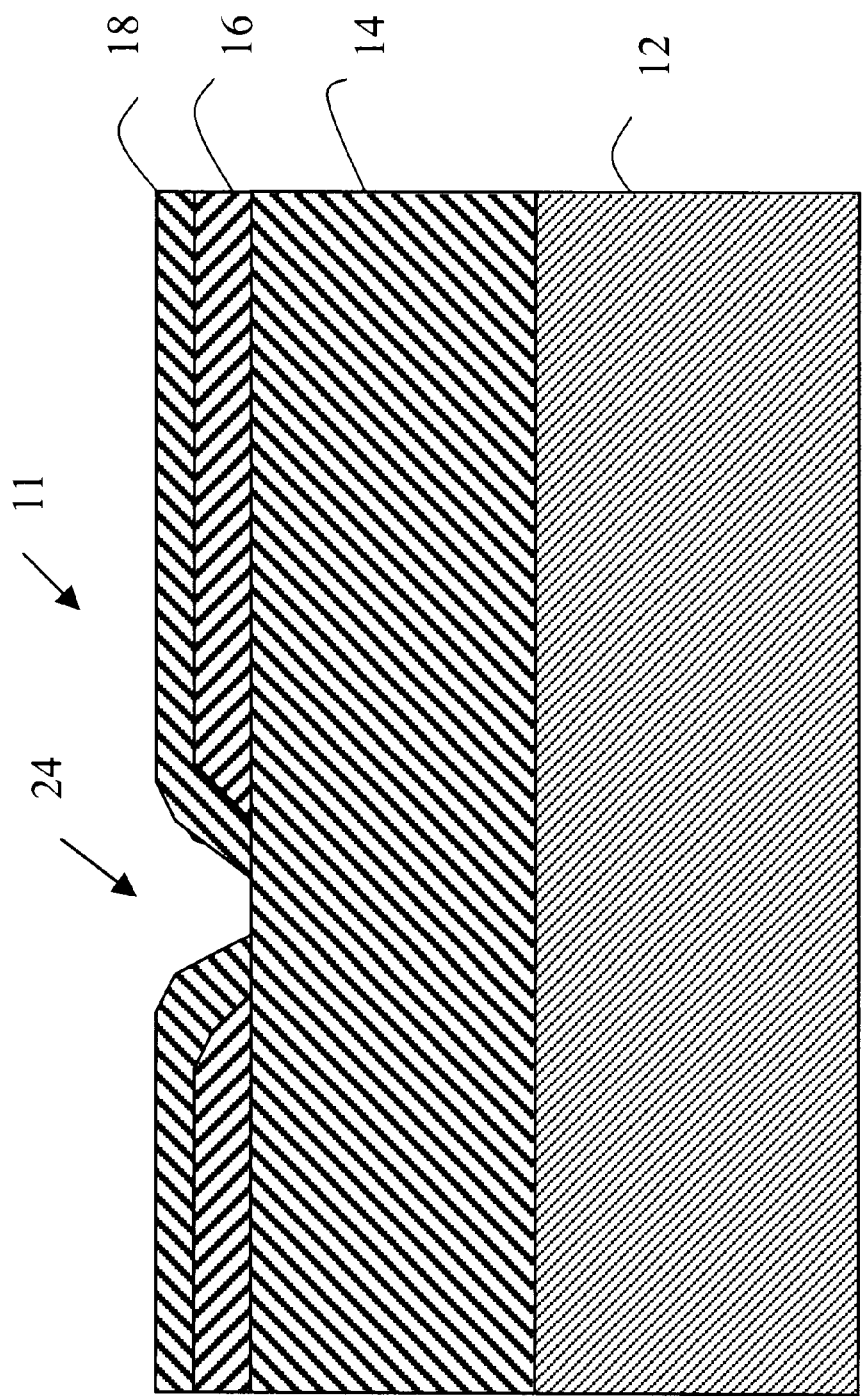
FIG. 6 is a schematic cross-sectional view of the substrate patterned by the lithographic system of FIG. 1, illustrating a reflow step according to yet another exemplary embodiment.

With reference to FIG. 6, portion 11 is subjected to a reflow process. Preferably, substrate 12 is heated in a low temperature reflow process, such as, by hot plate. The low temperature can be between 60 and 80 degrees Celsius. The low temperature process causes photoresist material 16 to become plasticized and deform, thereby narrowing the width of aperture 24. Preferably, the width of aperture 24 is narrowed by 20–40% or 500–1000 Angstroms due to the reflow process. Alternatively, other temperature ranges can be utilized.

A low temperature is utilized to prevent hot plate phenomena. The low temperature process can be utilized when material 16 is an ultrathin layer. Alternatively, higher temperatures in the range of 80 to 180 degrees Celsius can be utilized.

Silylation material 18 advantageously contains photoresist material 16 to ensure that portions of material 16 outside of aperture 24 remain covered. Thus, by using silylation material 18, a sufficient amount of material exists for the reflow technique even if an ultra-thin photoresist layer is utilized.

Figure 7:
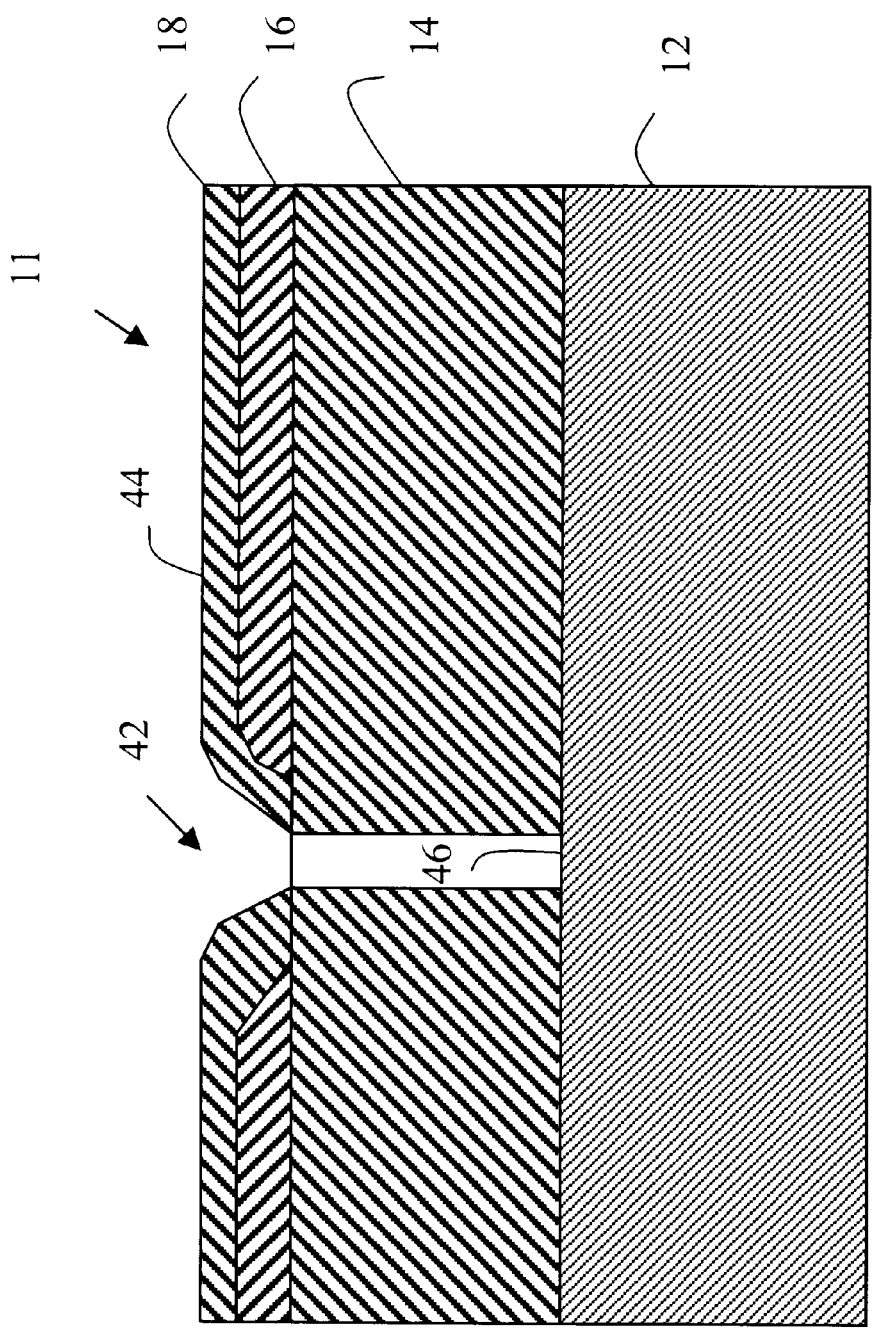
FIG. 7 is a schematic cross-sectional view of the substrate patterned by the lithographic system of FIG. 1, illustrating an etching step according to yet still another exemplary embodiment.

With reference to FIG. 7, after the reflow technique, portion 11 is subject to an etching process. The etching process provides an aperture 42 through layer 14. Aperture 42 preferably has a width associated with the width of aperture 24 after reflow (e.g., $k_1$ <0.5 Angstroms). Aperture 42 can extend from a top surface 44 of layer 14 to a bottom surface 46 of layer 14. Preferably, aperture 42 reaches a conductive line, contact, gate, source region, drain region, or other integrated circuit feature provided on or above substrate 12.

Figure 8:
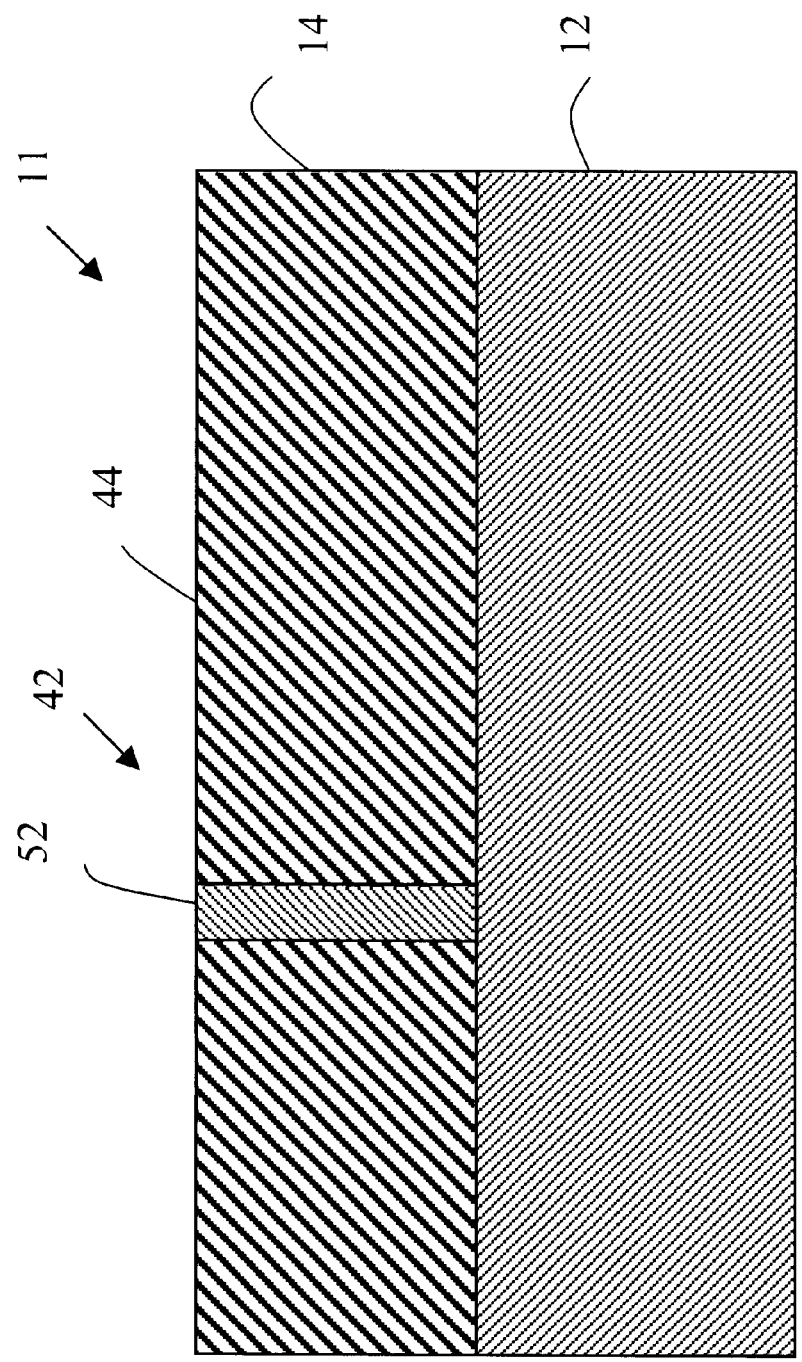
FIG. 8 is a schematic cross-sectional view of the substrate patterned by the lithographic system of FIG. 1, illustrating a contact formation step.

With reference to FIG. 8, silylation material 18 and photoresist material 16 is removed by wet ($H_2SO_4$) or dry ($O_2$ plasma) cleaning simultaneously. Alternatively, other removal processes can be utilized to strip materials 16 and 18.

After removal of materials 18 and 16, a conformal layer of conductive material is deposited in aperture 42 to leave a plug 52. Alternatively, the conformal layer can be deposited before materials 18 and 16 are removed. Plug 52 serves as a conductive via across layer of material 14. Plug 52 can be a metal, such as, titanium. After deposition, a chemical mechanical polish (CMP) can remove the material associated with plug 52 from a top surface of material 14.

Figure 9:
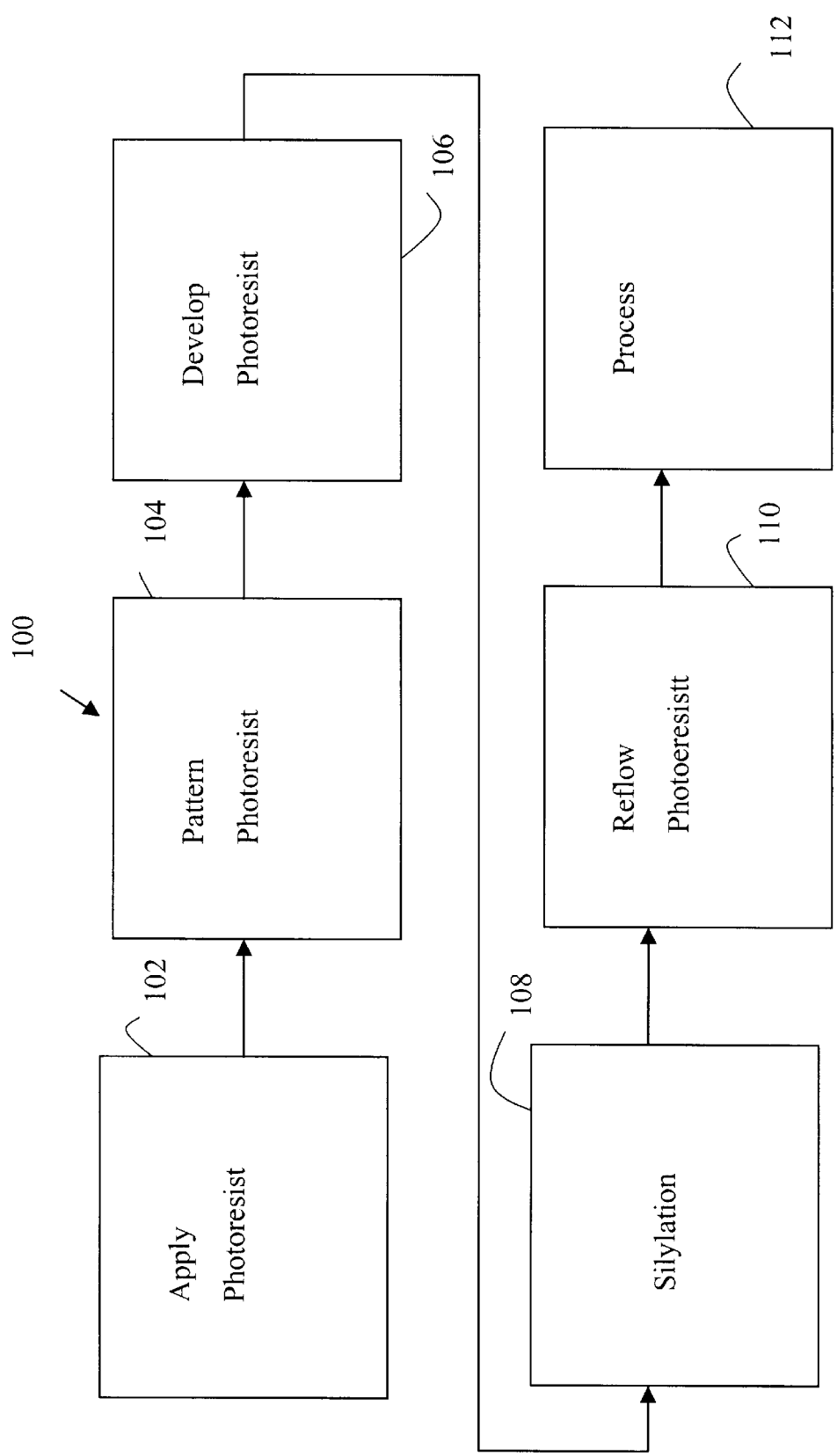
FIG. 9 is a flow diagram showing a process for manufacturing an integrated circuit in accordance with another exemplary embodiment.

With reference to FIG. 9, an exemplary flow diagram 100 is described. At a step 102, substrate 12 or a layer above substrate 12 is covered by photoresist material 16 (FIG. 3). At a step 104, substrate 12 is placed in a chamber and exposed to radiation. The exposure of radiation provides photochemical reactions in material 16 (FIG. 2).

At a step 106, material 16 on substrate 12 is processed in accordance with a development process to form aperture 24 (FIG. 4). At a step 108, a silylation process is carried out in which lateral sidewalls 22 of material 16 react with silicon agents and swell in size (FIG. 5).

At a step 110, material 16 is reflowed (FIG. 6). At a step 112, the integrated circuit fabrication process is continued and completed. The process can include the formation of a contact or plug 52 (FIG. 8).

While the embodiments illustrated in the figures and described above are presently preferred, it should be understood that these embodiments are offered by way of example only. For example, trenches or spaces in photoresist material 16 may be created in any of a variety of manners. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

providing a photoresist layer over a semiconductor substrate;

forming an aperture in the photoresist layer, the aperture having a width;

silylating the photoresist layer, whereby the width of the aperture is decreased; and reflowing the photoresist layer, whereby the width of aperture is further decreased.

2. The method of claim 1, further comprising:

processing the substrate in accordance with the aperture.

3. The method of claim 1, wherein the photoresist layer is an ultrathin photoresist layer.

4. The method of claim 2, wherein the processing step forms a contact.

5. The method of claim 4, wherein the ultrathin photoresist layer is less than 0.1 microns thick.

6. The method of claim 5, wherein the step of silylating the photoresist layer comprises providing gas phase silylation.

7. The method of claim 5, wherein the step of silylating the photoresist layer comprises providing liquid phase silylation.

8. The method of claim 5, wherein the reflow step is performed at a low temperature.

9. The method of claim 8, wherein the low temperature is less than 80 degrees Celsius.

10. A method of fabricating a contact for an integrated circuit, the method comprising:

providing a photoresist layer over an insulating layer above a substrate;

patterning the photoresist layer to remove a portion;

silylating the photoresist layer; and reflowing the photoresist layer.

11. The method of claim 10, further comprising etching the insulating layer in accordance with the photoresist layer to form an aperture in the insulating layer.

12. The method of claim 11, further comprising:

removing the photoresist layer.

13. The method of claim 12, further comprising:

depositing a conductive material in the aperture.

14. The method of claim 13, further comprising polishing the conductive material.

15. The method of claim 13, wherein silylating step forms silated sidewalls on the photoresist layer.

16. A method of forming narrow trenches in a layer of photoresist, the method comprising:

providing a photoresist layer;

patterning the photoresist layer to form a plurality of apertures having sidewalls;

silylating the sidewalls of the apertures in the photoresist layer; and reflowing the photoresist layer.

17. The method of claim 16, wherein the photoresist layer has a thickness of 0.1 micron.

18. The method of claim 16, wherein the photoresist layer has a thickness of less than 1.0 microns.

19. The method of claim 16, wherein the apertures have a width of one lithographic feature.

20. The method of claim 16, wherein a distance between the sidewalls is less than one lithographic feature.

* * * * *